US 6,567,435 B1

(12) United States Patent
Scott et al.

(10) Patent No.: US 6,567,435 B1
(45) Date of Patent: May 20, 2003

(54) VCSEL POWER MONITORING SYSTEM USING PLASTIC ENCAPSULATION TECHNIQUES

(75) Inventors: Jeffrey W. Scott, Santa Barbara, CA (US); Dale Isaacson, Alice, CO (US); Tehseen Abidi, Westminster, CO (US)

(73) Assignee: Optical Communication Products, Inc., Chatsworth, CA (US)

( * ) Notice: Subject to any disclaimer, the term of this patent is extended or adjusted under 35 U.S.C. 154(b) by 0 days.

(21) Appl. No.: 09/531,442

(22) Filed: Mar. 20, 2000

Related U.S. Application Data
(60) Provisional application No. 60/125,230, filed on Mar. 19, 1999.

(51) Int. Cl.[7] .................................................. H01S 3/13
(52) U.S. Cl. .................................. 372/29.021; 257/729
(58) Field of Search .............................. 372/43, 44, 46, 372/50, 101, 99, 103, 96, 49

(56) References Cited

U.S. PATENT DOCUMENTS

| | | | |
|---|---|---|---|
| 4,421,383 A | 12/1983 | Carlsen | 350/96.21 |
| 5,226,052 A | 7/1993 | Tanaka et al. | 372/36 |
| 5,537,504 A | 7/1996 | Cina et al. | 385/93 |
| 5,905,750 A * | 5/1999 | Lebby et al. | 372/50 |
| 5,953,355 A * | 9/1999 | Kiely et al. | 372/43 |
| 6,001,664 A * | 12/1999 | Swirhun et al. | 438/31 |
| 6,069,905 A | 5/2000 | Davis et al. | 372/43 |
| 6,160,834 A * | 12/2000 | Scott | 372/96 |

FOREIGN PATENT DOCUMENTS

| | | |
|---|---|---|
| EP | 0786838 A2 | 7/1997 |
| EP | 0786838 A3 | 10/1997 |
| EP | 0865122 | 9/1998 |
| JP | 10126002 | 5/1998 |

* cited by examiner

*Primary Examiner*—Paul Ip
*Assistant Examiner*—Davienne Monbleau
(74) *Attorney, Agent, or Firm*—Barlow, Josephs & Holmes, Ltd.

(57) ABSTRACT

A plastic encapsulated VCSEL and power monitoring system wherein the VCSEL and photodetector are encapsulated in an optoelectronic plastic molding material. A tilted window, with a partially reflective coating on one side, is attached to the top of the plastic molding material using an epoxy with a refractive index that substantially matches the molding material. The plastic encapsulated VCSEL and photodetector may be manufactured at low cost using standard molding techniques. The high optical quality of the tilted window and partially reflective coating provide an excellent surface to reflect a portion of the optical beam back to the photodetector. Also, the tilted window substantially reduces inconsistent power monitoring due to beam divergence and walk-off.

9 Claims, 24 Drawing Sheets

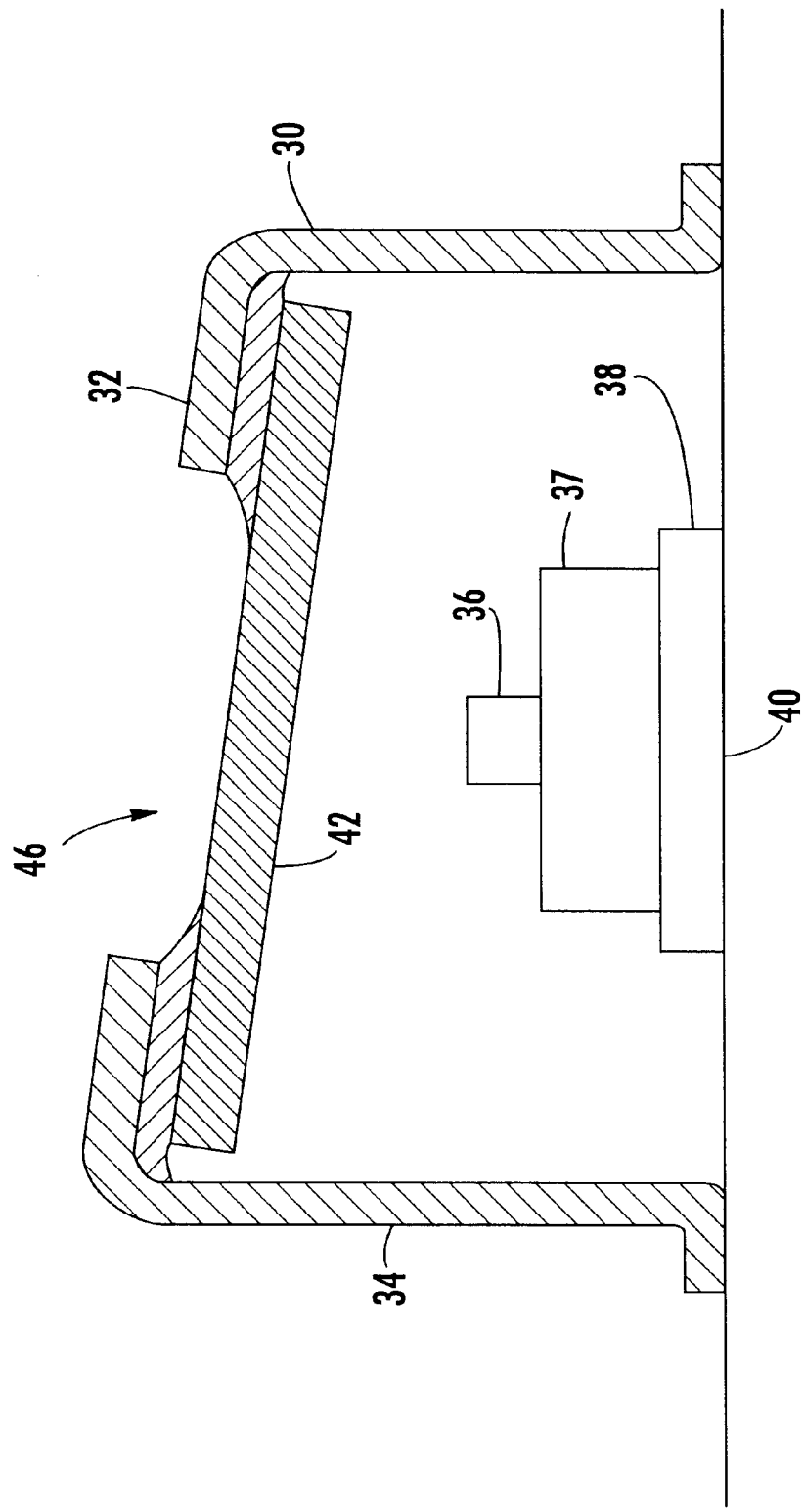

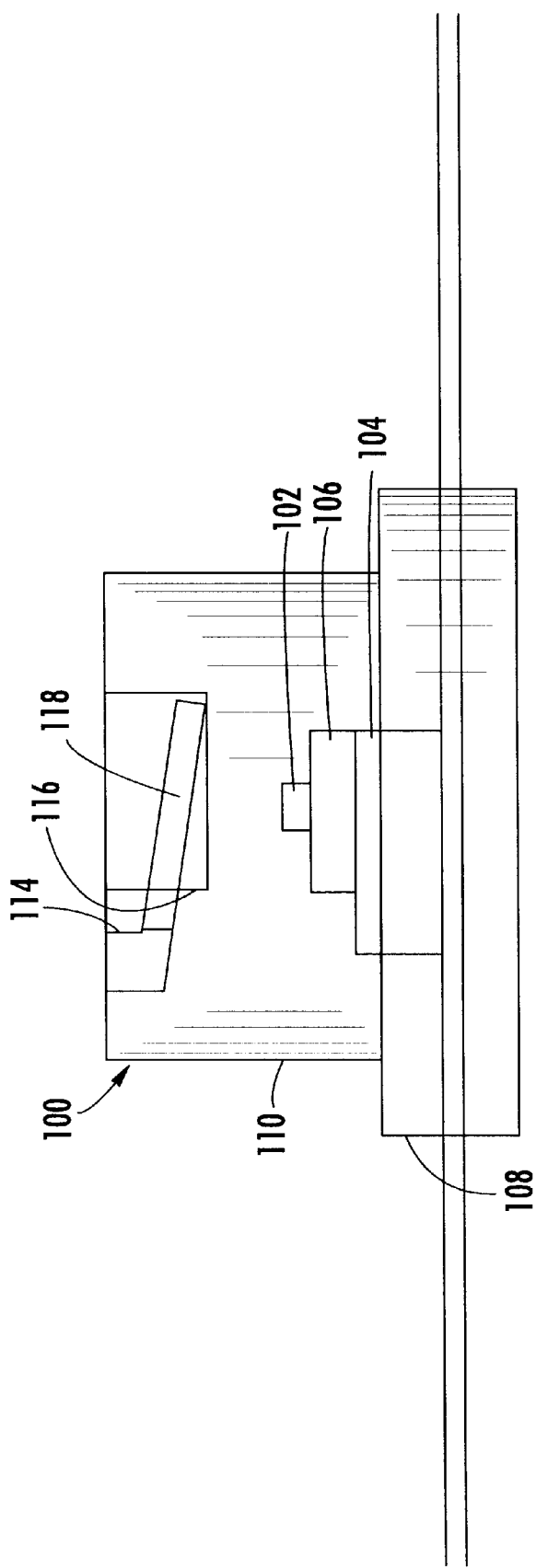

VCSEL POWER MONITORING SYSTEM USING PLASTIC ENCAPSULATION TECHNIQUES

CROSS-REFERENCE TO RELATED APPLICATION

This application claims the benefit of U.S. Provisional Patent Application No. 60/125,230, filed Mar. 19, 1999, the contents of which are hereby incorporated by reference.

FIELD OF THE INVENTION

This invention relates to power monitoring systems for controlling the output of a laser, and more particularly to a vertical cavity surface emitting laser (VCSEL) power monitoring system using plastic encapsulation and index of refraction discontinuities for reflecting a portion of the radiated light from the VCSEL onto a photodetector.

BACKGROUND

VCSELs are semiconductor lasers that emit light from the chip surface, as opposed to conventional edge emitting semiconductor lasers that emit light from the cleaved edge of the device. In fiber optic systems and certain other applications, an optical subassembly for coupling the laser beam to the fiber includes a metal package and a ball lens. The metal package forms a hermetic seal for the laser and a photodetector, and further includes a cap having an aperture covered by a window that is substantially parallel to the output facet of the laser. The photodetector is positioned to monitor a portion of the radiated light reflected from the window and the lens. The output current of the photodetector, which is proportional to the amount of light incident upon it, is fed back as input to the drive circuitry for adjusting the drive current to the laser in order to maintain a consistent laser output over temperature.

A significant disadvantage of conventional, hermetic packages is high cost. A plastic encapsulated package for the VCSEL and photodetector provides cost savings in both materials and manufacturing processes by utilizing industry standard optoelectronic molding techniques. Another disadvantage of the conventional package is that depending on the beam qualities of the laser, a varying fraction of the radiated light may be incident on the photodetector, which results in inaccurate monitoring. For low divergence beams, only the back reflection from the lens reaches the photodetector while the beam from the window falls back on the laser itself. As output increases with increasing drive current, the beam diverges, causing the back reflection from the window to reach the diode and the back reflection from the lens to walk off of the photodetector. This spatial filtering results in inconsistent monitoring and feedback over the specified range of drive currents and temperatures. The detrimental effect is increased by modal variations in the laser output which further cause the drive circuit to improperly compensate for variations in the photocurrent that are not representative of the laser output. Those skilled in the art would desire a VCSEL power monitoring system that provides consistent power monitoring and feedback at substantially all currents and temperatures within the normal operating range of the VCSEL.

In response to the drawbacks of the prior art, U.S. Pat. No. 5,809,050 (the '050 patent) discloses a number of different power monitoring systems for VCSELs that purport to generate a light beam having a controlled intensity. The disclosed systems include packages housing a VCSEL, a photodiode and a beamsplitter for dividing the radiated beam into a fraction and a remainder, the remainder being the light beam output from the package. The beam splitter operates by diffraction, scattering, or transmission to direct a fraction of the radiated light beam towards the photodiode. While addressing some of the disadvantages of the prior art, the package disclosed in the '050 patent is unnecessarily complex as it requires precise alignment of the photodetector within the package to receive the fraction of the radiated light. In the only embodiment disclosed in the '050 patent that involves partial reflection of the radiated light, the photodiode is mounted perpendicular to the laser with an angled beamsplitter mounted in the optical path at a 45 degree angle between the devices. The package disclosed in the '050 patent, however, requires tight manufacturing tolerances. First, the photodiode must be aligned with respect to the laser, and then the beamsplitter must be placed at the correct angle and oriented with respect to both the laser and photodiode to properly reflect a fraction of the radiated beam on to the photodiode.

In addition, U.S. Pat. No. 5,812,582 also discloses a power monitoring system utilizing a hermetic package with a window to reflect a portion of the light emitted from the VCSEL to a photodiode mounted in the package. However, both the '050 and '582 patents have the disadvantages that they require costly materials and manufacturing processes. In addition, the power monitoring systems disclosed in the '050 and '582 patents may result in inaccurate monitoring due to varying divergence angles of the beam emitted from the VCSEL.

SUMMARY OF THE INVENTION

There is therefore provided according to the present invention, a plastic encapsulated VCSEL power monitoring system that is relatively easy to manufacture and provides consistent power monitoring and feedback. The system includes a package containing a plastic encapsulated VCSEL, a photodetector, and a tilted beamsplitter, also referred to as a window, for reflecting a portion of the light from the VCSEL toward the photodetector.

In a presently preferred embodiment the VCSEL and photodetector are mounted adjacent to each other on a metal leadframe. The VCSEL, photodetector and leadframe are encapsulated in an optoelectronic plastic molding material. A tilted window, with a partially reflective coating on one side, is attached to the top of the plastic molding material using an epoxy with a refractive index that substantially matches the molding material. In this embodiment, the plastic encapsulated VCSEL and photodetector can be manufactured at low cost using standard molding techniques without special care given to the optical quality of the top surface of the plastic molding. Minor optical imperfections in this top surface of the plastic molding can be effectively eliminated by the use of the index matched epoxy which attaches the window to the plastic molding. The high optical quality of the window and partially reflective coating provides an excellent surface to reflect a portion of the optical beam back to the photodetector. Also, the tilted window substantially reduces inconsistent power monitoring due to beam divergence and walk-off. The degree of tilt of the window is chosen to capture a certain percent of the transmitted light, which is representative of the entire beam, to enable consistent feedback to the drive circuitry over the specified range of drive currents, taking into account modal distribution and temperature variations.

In another alternate embodiment of the present invention, the plastic encapsulation is adapted to conform to the small form factor (SMFF) package for optical transceivers. Conventional optical transceivers use separate optical subassemblies (OSAs) to couple the light from the source to a fiber (TX), and focus the incoming optical signal from the fiber to a detector (RX). The separate housing for the transmitter and the receiver OSAs in the conventional transceiver results in a bulkier module that requires additional space. This is not in line with the needs of the rapidly growing fiber optics industry whose demands for faster communications call for increasing the number of optical interconnects, which means reducing their size. To address industry needs, the SMFF package has evolved for transceivers in which the maximum distance between the optical axes of the transmitter and the receiver optics may be as close as 750 microns. The present invention includes a plastic SMFF package having a tilted window in the transmitter portion for realizing the previously described benefits on power monitoring.

BRIEF DESCRIPTION OF THE DRAWINGS

These and other features of the present invention will be better understood by reading the following detailed description in conjunction with the accompanying drawings, wherein:

FIG. 4 is a cross sectional diagram of a metal package with an angled cap design according to a presently preferred embodiment of the present invention;

FIG. 9 is a perspective view of a plastic encapsulation package for replacement of the conventional package of FIG. 1;

DETAILED DESCRIPTION

Figure 1:
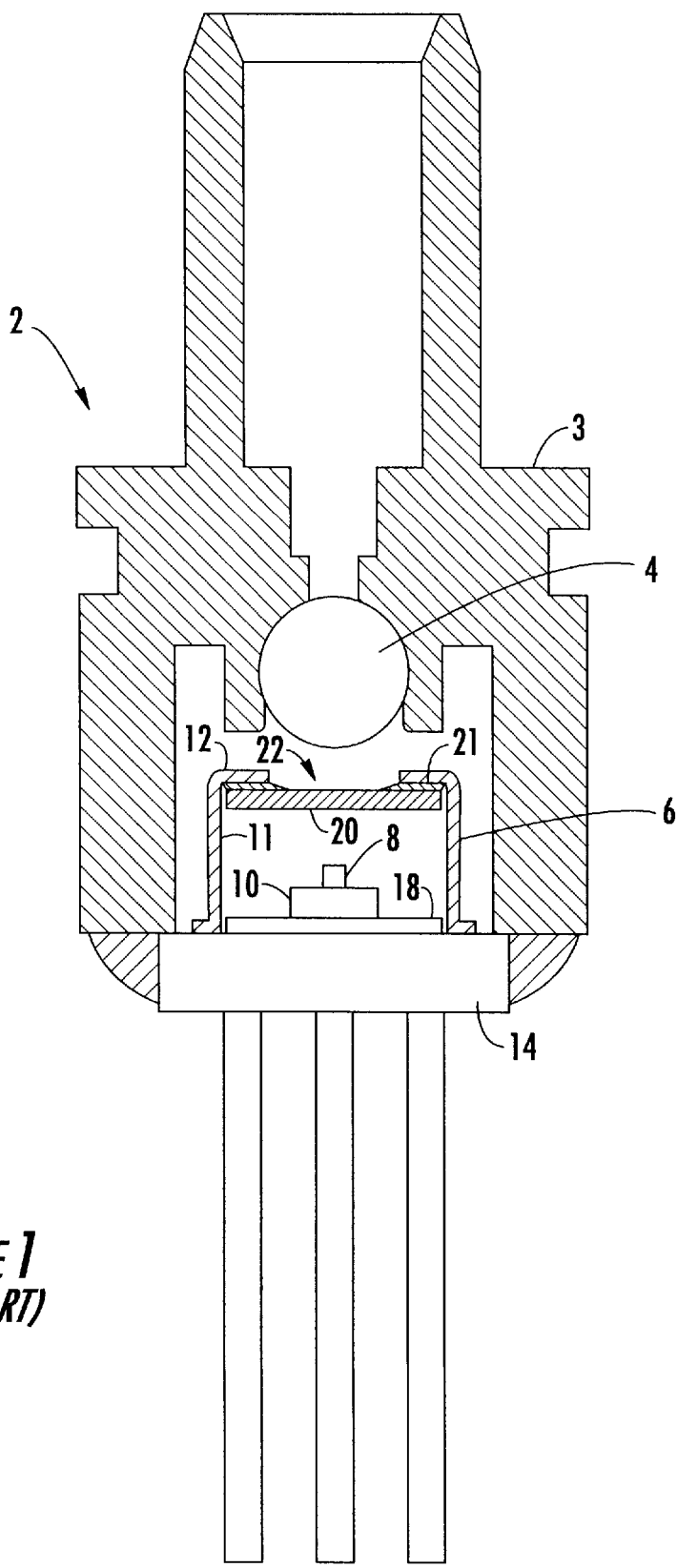
FIG. 1 is a cross sectional diagram of a conventional optical subassembly including a ball lens and a metal package with a window substantially parallel to the output facet of the VCSEL.

Referring to FIG. 1, a prior art power monitoring system includes a conventional optical subassembly 2 for coupling a laser beam to a fiber optic cable. The optical subassembly includes a lens barrel 3 housing a ball lens 4 and a metal package 6 housing a VCSEL die 8 and a photodiode 10 for monitoring a portion of the light radiated from the VCSEL. The photodiode generates a current that is proportional to the amount of light incident on the photodetector. The current is provided as feedback to conventional drive circuitry (not shown) that varies the drive current to the VCSEL as necessary to maintain consistent power output.

The conventional metal package 6, one of which is known in the industry as "T0-56", includes a cylindrical sidewall portion 11 and a cap portion 12 integrally formed on the sidewall parallel to the optical subassembly base 14. The VCSEL die 8 is mounted on a photodiode 10, which may be mounted on a conductive or insulative standoff 18 at the base of the package. The cap includes a glass window 20 affixed within the cap with a suitable adhesive 21 to cover an aperture 22. The window reflects a portion of the radiated light back toward the photodiode. The ball lens 4 also reflects a portion of the radiated light toward the photodiode.

Figure 2:
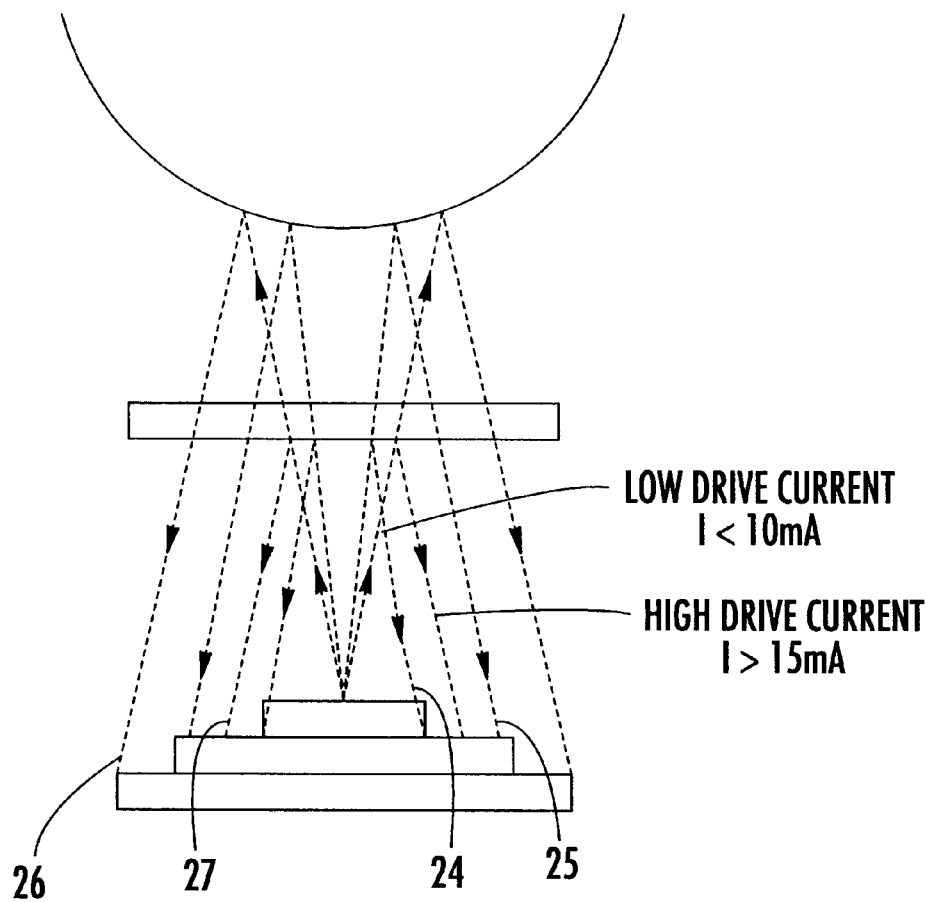
FIG. 2 is a ray diagram for the conventional metal package of FIG. 1, showing the path of light reflected from the window and ball lens at low and high drive currents.
Figure 3A:
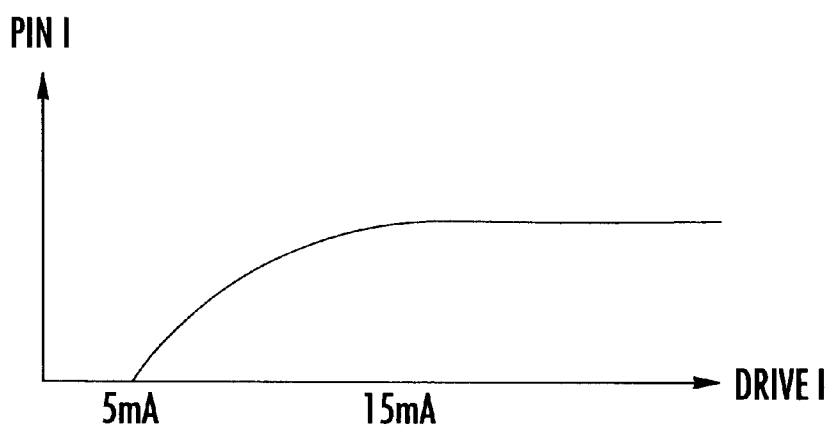
FIGS. 3A–C are graphical depictions of photodiode current vs. drive current for the power monitoring system of FIG. 1.
Figure 3B:
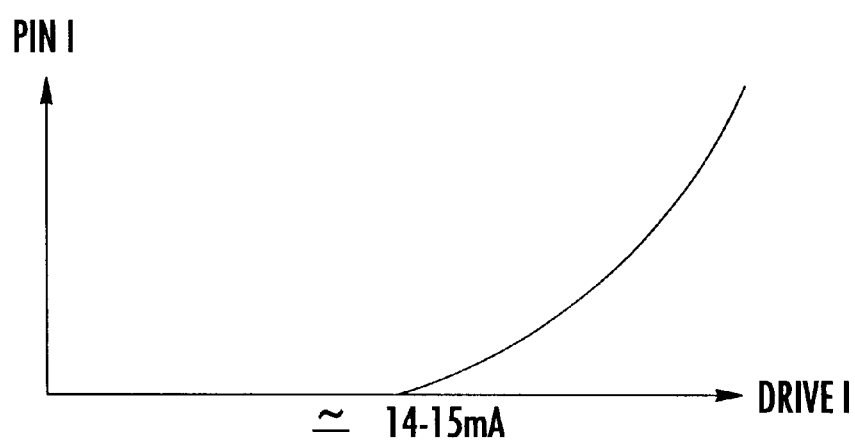
Figure 3C:
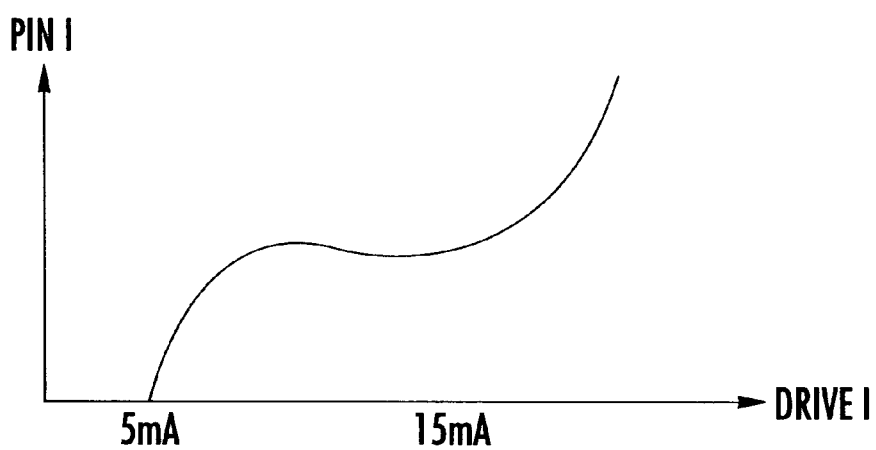
Figure 5:
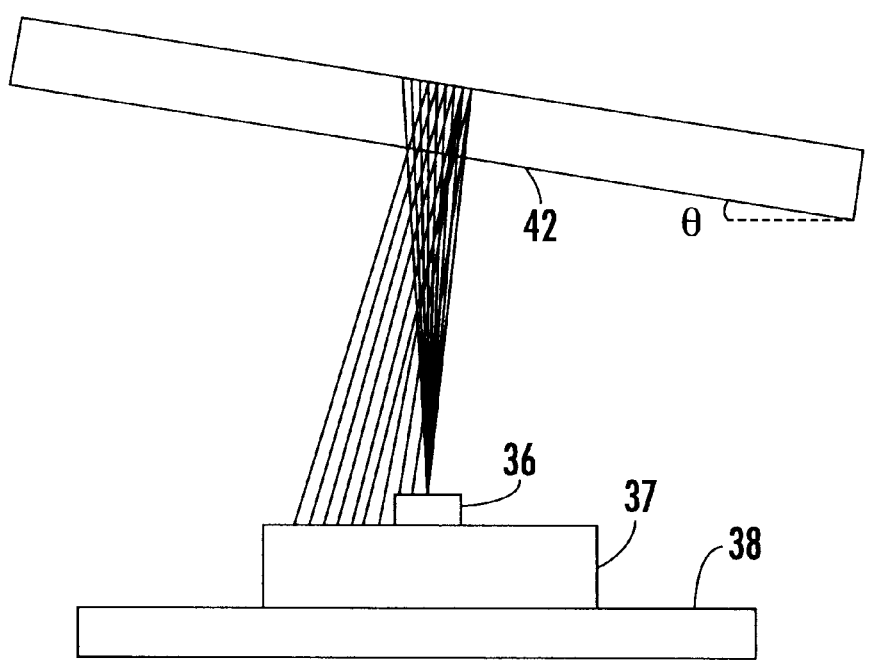
FIG. 5 is a ray diagram showing the path of light reflected from the tilted window in the metal package of FIG. 4.

In operation, the conventional system often provides unreliable results due to increasing beam divergence with increasing drive currents and temperature. Referring to FIG. 2, at low drive currents (e.g., less than 10 mA), the divergence is so low that almost the entire light beam reflected from the window returns to the VCSEL die (e.g., ray 24). Thus for low drive currents, the photodiode primarily detects only the light reflected from the lens. At high drive currents (e.g., above 15 mA) as the divergence increases, the light reflected from the lens walks off the side of the photodiode (e.g., ray 26), and light from the window walks on to the photodiode (e.g., ray 27). The graphs of FIGS. 3A–3C respectively show PIN current vs. drive current due to light reflected from the ball lens, window, and both the ball lens and window.

In addition to inconsistent monitoring due to back reflections from different optical elements, the laser threshold increases and the slope decreases as the temperature is increased. Furthermore, the PIN current may vary even at constant temperature because the spatial multi-modal power distribution of the radiated VCSEL beam may vary in time. If only a small portion of the radiated beam is captured by the photodiode, the resulting current generated by the photodiode may not accurately reflect the total amount of light being radiated in the transmit beam. Such variations introduce additional error into the monitoring and feedback system.

Referring to FIG. 4, in an exemplary embodiment, the power monitoring system according to the present invention includes a metal package 30 modified by any suitable technique in which the cap portion 32 of the package is angled over the sidewall 34. The system includes a VCSEL die 36 mounted on a photodiode 37 affixed to a standoff 38. A translucent, preferably glass window 42 with the same degree of tilt as the angled cap is mounted on the cap by any suitable means, such as by adhesive 44 to cover the aperture 46. The tilted window has the effect of reflecting a substantial portion of the light at both low and high current toward the photodetector, which in turn enables controlled feedback.

The window is preferably tilted at an angle that ensures controlled feedback at all drive currents and temperatures within the specified range of operation. This is accomplished in the present invention by capturing on the photodiode a percentage of light reflected from the window sufficient to provide accurate and reliable monitoring and feedback within the normal operating conditions of the device. Because the laser has a $TEM_{11}$ (donut) profile, the window needs to be tilted only slightly (less than 5 degrees). Keeping in mind that the beam divergence increases with temperature, this tilt is enough to ensure a minimum variation in feedback over a typical temperature range of 10° C. to 80° C. Those of ordinary skill in the art will understand that the angle of tilt may vary depending on, for example, the placement of the photodiode within the package and the distance between the surface of the VCSEL die and the window.

Figure 6:
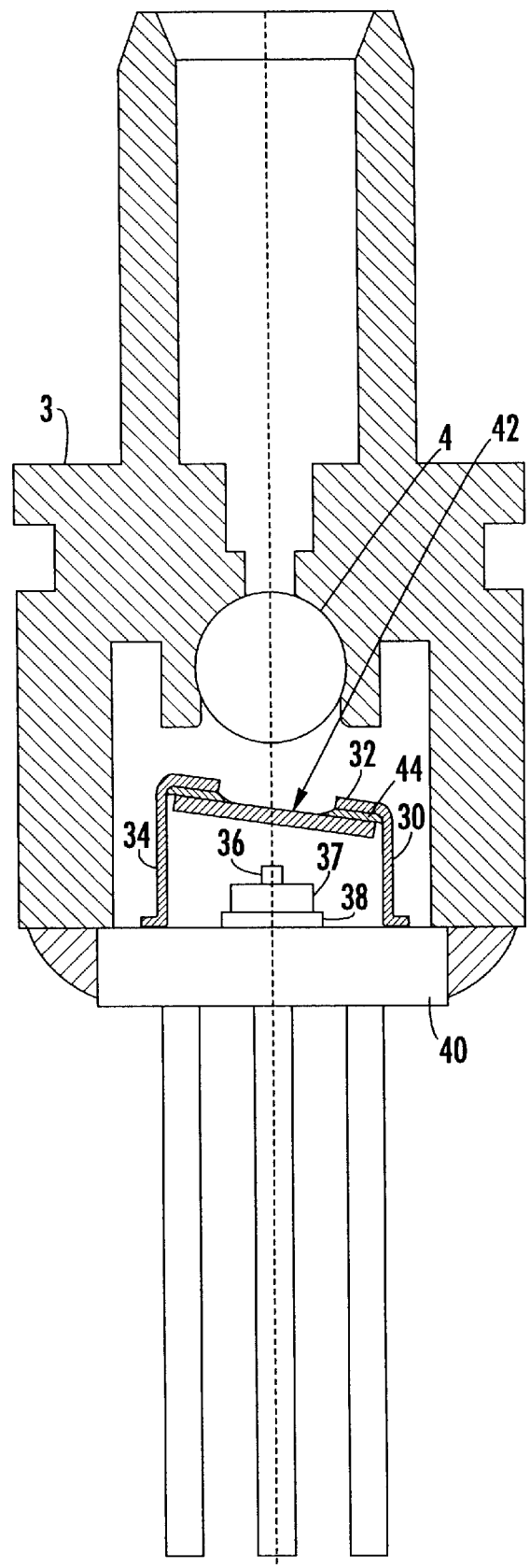
FIG. 6 is a cross sectional diagram of the metal package of FIG. 4 incorporated in an otherwise conventional optical subassembly.

The exemplary embodiment has the added benefit of being relatively easy to manufacture. Because the photodiode is centered under the VCSEL, the photodiode and cap do not have to be precisely aligned to capture the rays of the laser, as is the case in an embodiment having the photodiode offset to one side of the VCSEL or where the photodiode is placed on or adjacent the wall of the package. Furthermore, the fairly low degree of window tilt ensures adequate space for housing the VCSEL die over the photodiode, and enables a modified package with dimensions that allow the angled cap package to be used as a replacement for existing conventional packages having flat caps in otherwise conventional optical subassemblies. FIG. 6 shows the metal package with the angled cap according to the present invention within a conventional optical subassembly.

Figure 7:
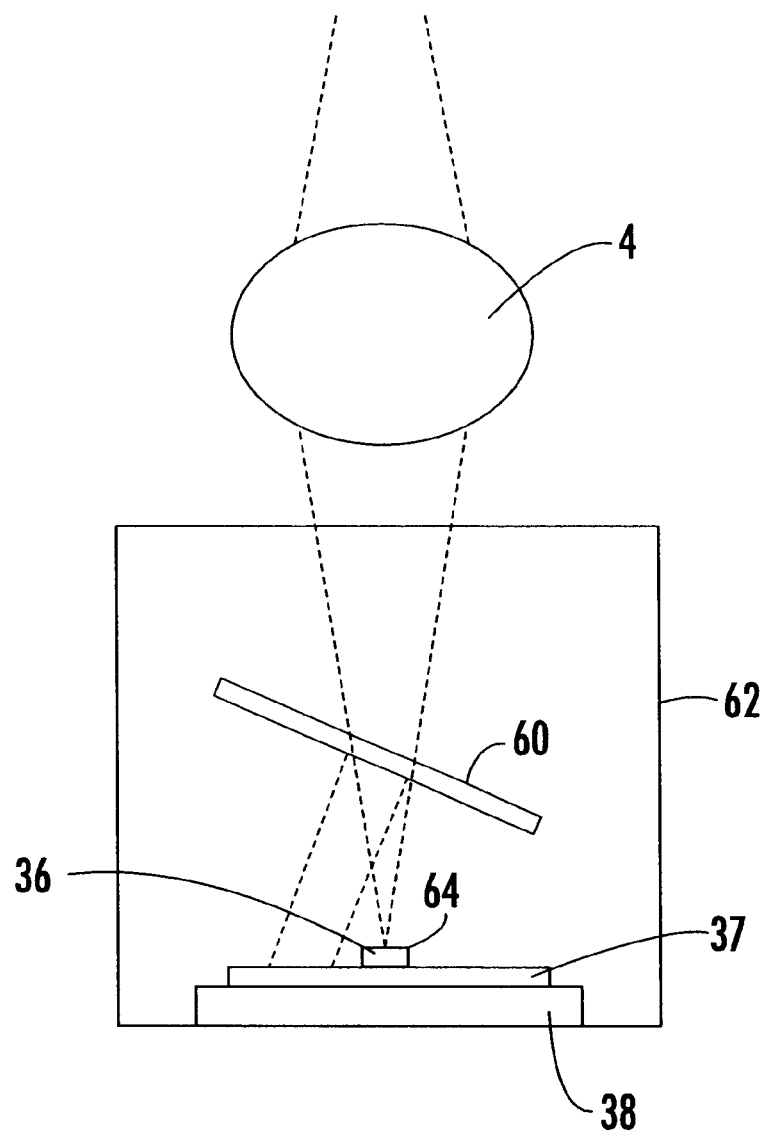
FIG. 7 is a cross sectional diagram of an alternate embodiment of the present invention having a tilted window mounted within a conventional hermetically sealed package.

In alternate embodiments of the present invention, the window is mounted at an angle either inside or outside the package. Referring to FIG. 7, a tilted window 60 is housed inside of a conventional hermetically sealed package 62. In this embodiment, the proximity of the window to the VCSEL die surface 64 requires a greater angle of tilt to obtain the minimum percent of the transmitted energy on the photodiode sufficient for controlled feedback. Unlike the embodiment in which the window is adhered to an angled cap, the window does not need to have a diameter larger than necessary to reflect the beam. The window can be mounted within the package by any suitable means. In this embodiment, the sidewalls of the package may have to be extended to house the mirror, in some cases requiring adjustment of the lens barrel to ensure enough space for the modified package.

Figure 8:
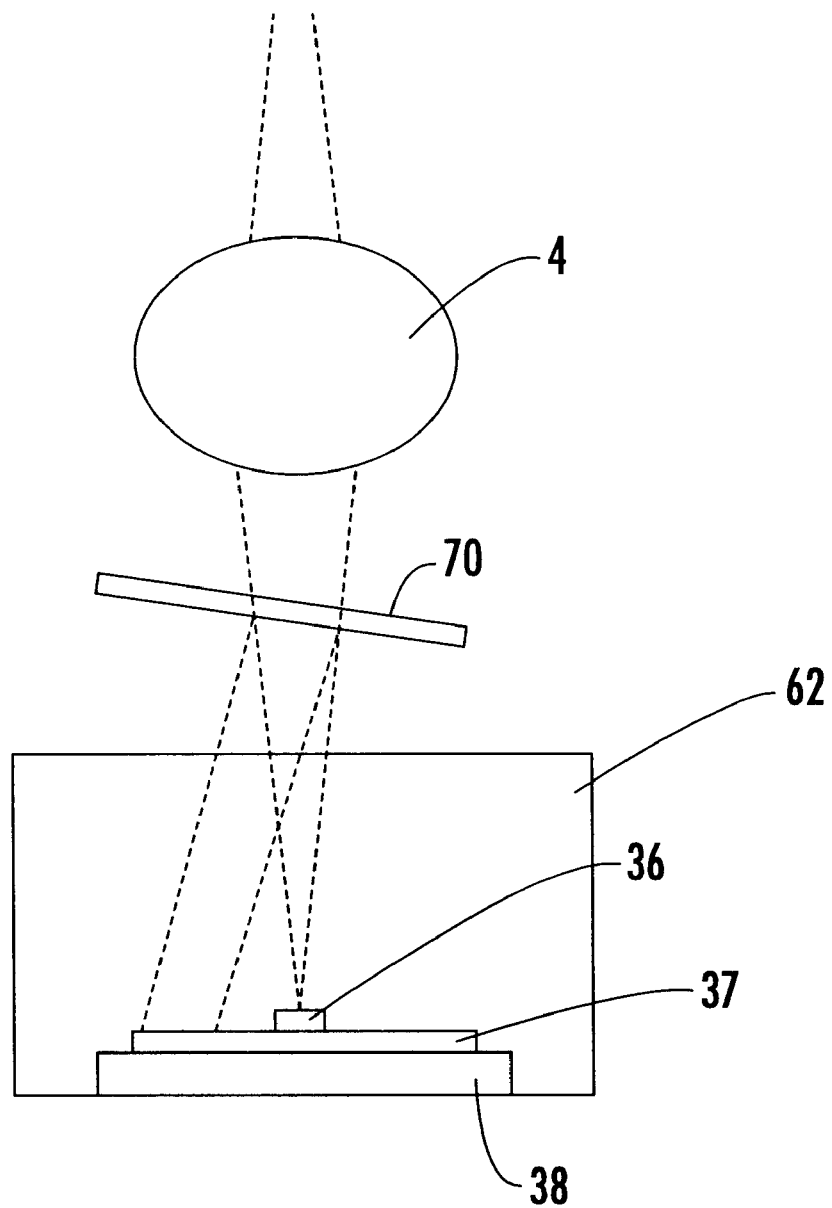
FIG. 8 is a cross sectional diagram of another alternate embodiment of the present invention having a tilted window mounted outside the package within the lens barrel of the optical subassembly.

Referring to FIG. 8, in another alternate embodiment, the tilted window 70 is mounted within the lens barrel. The tilted window can be mounted on the barrel by any suitable means. As in the other embodiments, the window is preferably positioned and angled to reflect an adequate amount of light back to the photodiode. Because the window is further away from the laser, the window may be almost flat or tilted at even lesser angles than in the preferred embodiment.

A second principal embodiment of the invention relates to encapsulating the VCSEL, photodiode, and in some cases, the window itself, in plastic. The primary benefits of a plastic package are cost and manufacturability, which may be superior to the conventional metal package. The plastic encapsulation should preferably be optical grade plastic suitable for encapsulating a laser and other semiconductor components while also allowing transmission of light. One suitable plastic is sold by Dexter Electronic Materials Division, Industry, California, under the trademark HYSOL®.

The plastic encapsulation package preferably contains a tilted window beamsplitter for obtaining accurate monitoring and feedback as previously described. The beamsplitter window may be formed of an air gap, glass, plastic or adjacent media of differing indices of refraction, and may be fabricated in a number of ways. The various embodiments of the invention take into account the differing indices of refraction to provide the proper feedback of radiated light toward the photodiode. In addition, the geometries are preferably chosen to ensure a consistent sampling of the beam at both high and low beam divergence which may result from different drive currents and temperatures. The invention also serves to reduce inaccuracy in monitoring and feedback due to modal variations in the radiated beam.

Referring to FIG. 9, in a presently preferred embodiment of the plastic encapsulated package of the present invention, the plastic encapsulation package 100 has substantially the same dimensions as the conventional metal package 6 (FIG. 1) used in the conventional optical subassembly 2 of FIG. 1. This embodiment has the advantage of allowing replacement of the conventional package in the conventional subassembly without significantly impacting other aspects of the subassembly. The encapsulation substantially encapsulates a VCSEL die 102 and a photodiode 106 which may be mounted on a conductive or insulative stand 104 for electrical or thermal dissipation considerations.

The package preferably includes a base portion 108 that replaces the standoff 14 (FIG. 1) in the conventional optical subassembly, and a cylindrical body portion 110 which is formed by the encapsulation material. The top 112 of the body portion preferably contains a recess 114 containing a ledge 116. The ledge is positioned to house a tilted window beamsplitter 118 in optical alignment with the VCSEL for reflecting a portion of the radiated light toward the photodiode 106. The window is preferably glass. The index of refraction of the glass, in conjunction with the indices of refraction of air in the recess and the plastic encapsulation, provides the necessary refraction to appropriately direct a representative sample of the radiated beam onto the photodetector while transmitting an undistorted beam into the output.

Figure 10A:
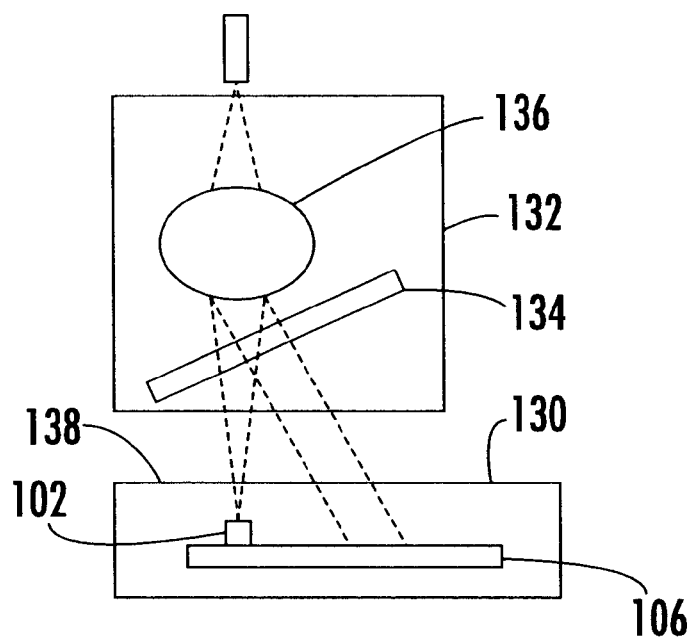
FIG. 10 is a diagram of a plastic package encapsulating the VCSEL and photodiode in which a tilted window placed inside the lens barrel. The VCSEL is placed on the photodiode (FIG. 10a) or adjacent to it (FIG. 10b)
Figure 10B:
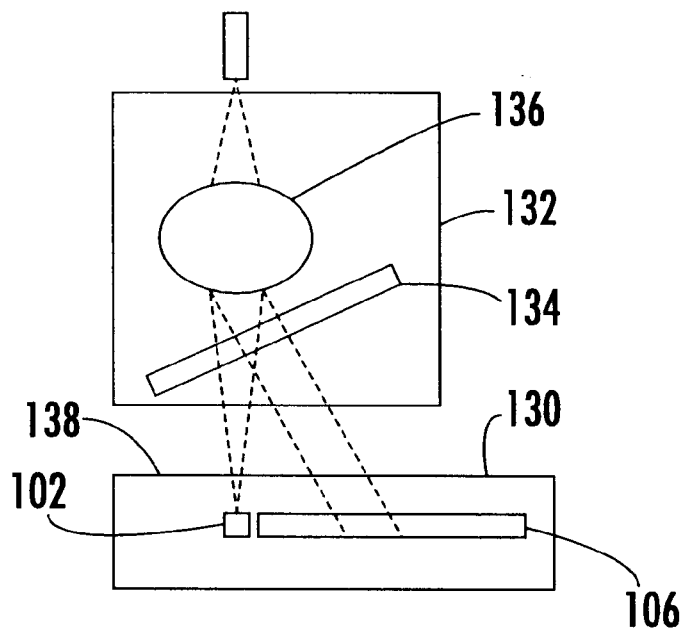

Referring to FIGS. 10a and 10b, in an alternate embodiment of the plastic encapsulation package, the package 130 encapsulates the VCSEL die 102 and photodiode 106. A modified lens barrel 132 houses a tilted window 134 and ball lens 136. The window may be mounted within the lens barrel by any suitable means, so long as the appropriate angle is reached without interference with the optical path. The VCSEL die 102 is preferably centered with respect to the tilted window 134 and the optical axis of the ball lens. The VCSEL die 102 may be placed either on one end of the photodiode (FIG. 10a), or placed next to the photodiode (FIG. 10b). A surface 138 of the plastic encapsulated piece is preferably located as close to the uppermost surface of the VCSEL die as possible to provide a compact plastic encapsulation part, as the design does not depend on the plastic mold-air boundary for feedback. Feedback is received though light reflected from the tilted window 134 and refracted at the air and plastic boundary. The tilted window 134 is preferably made of glass for its stability and highly parallel surfaces, but may also be made of plastic or other suitable material.

Figure 11:
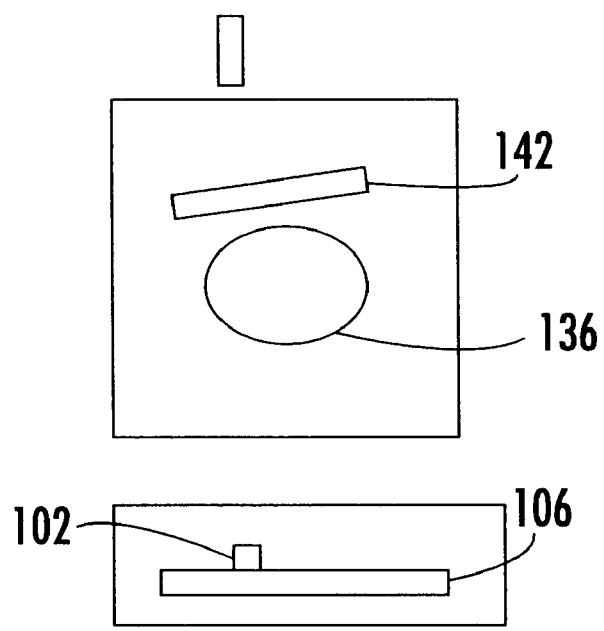
FIG. 11 is a diagram of an alternate embodiment of the plastic package of FIG. 10 in which the tilted window in the lens barrel is placed after the lens.

Referring to FIG. 11, in another alternate embodiment, a plastic package 140 encapsulates VCSEL die 102, which is placed in substantially the same configuration with respect to the photodiode 106 and ball lens 136 as in FIG. 10a, except that a tilted window 142 is placed after the ball lens 136. In this embodiment, the window is preferably tilted less because it is further from the photodiode. In this design the rays are focused back on the photodiode by the ball lens 136. Less than 5 degrees of tilt is all that is required to deflect the back reflected and converging beam away from the VCSEL on to the photodiode 106. In this design the rays are not reflected straight back, but instead focused by the ball lens on the photodiode. The design is somewhat complicated since the rays are not be reflected straight back, but may instead traverse a portion of the lens. In this embodiment, the rays bend and focus inside the lens, diverge, and fall on the photodiode.

Figure 12:
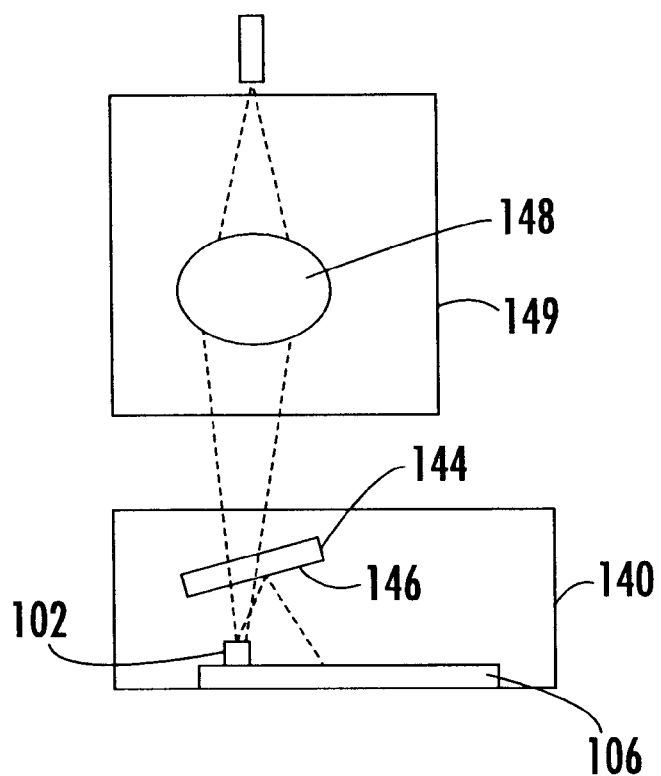
FIG. 12 is a diagram of a plastic package in which a glass plate with a reflective coating on one side is inserted inside the plastic housing during the molding process.

Referring to FIG. 12, the plastic package 140 (index n1) (n1) preferably encapsulates the VCSEL die 102, photodiode 106 and a tilted window 144 made of glass having a refractive index (n2). The tilted window 144 is preferably coated with a quarter wave reflective coating 146 having a refractive index (n3). The coated tilted window is preferably encapsulated inside the plastic housing during the injection molding process. The reflectance may be increased by increasing the index ratio n2/n3. In this embodiment, the refractive index (n3) of the quarter wave reflective coating 146 is preferably higher than the refractive index (n1) of the plastic package 140. Typically, the index of plastic, n1, and the index of glass, n2, are quite similar. Hence, the power reflection at the interface, given by the square of the ratio (n1−n2)/(n1+n2), would be quite small. By coating the surface of the glass with a quarter wave thick layer of material with differing index n3, a significant reflection can easily be created in a manufacturable process.

For example, if the plastic has an index of 1.5 and the glass has an index of 1.45 the net reflection would only be 0.03%. If, however, the surface is coated with a quarter wavelength thick layer of silicon nitride, n3=2.0, the reflection would be increased to 9%. This approach has the advantage of ease of manufacturing since the nitride can be uniformly and precisely deposited using conventional techniques such as plasma enhanced chemical vapor deposition. The reflective coating should preferably be uniform to avoid distorting the beam, and can be optimally designed for a quarter wavelength thickness with an incorporation of any multiple half wavelengths as is desirable from a manufacturing perspective. The lens 148 is preferably housed in a conventional lens barrel 149.

Figure 13:
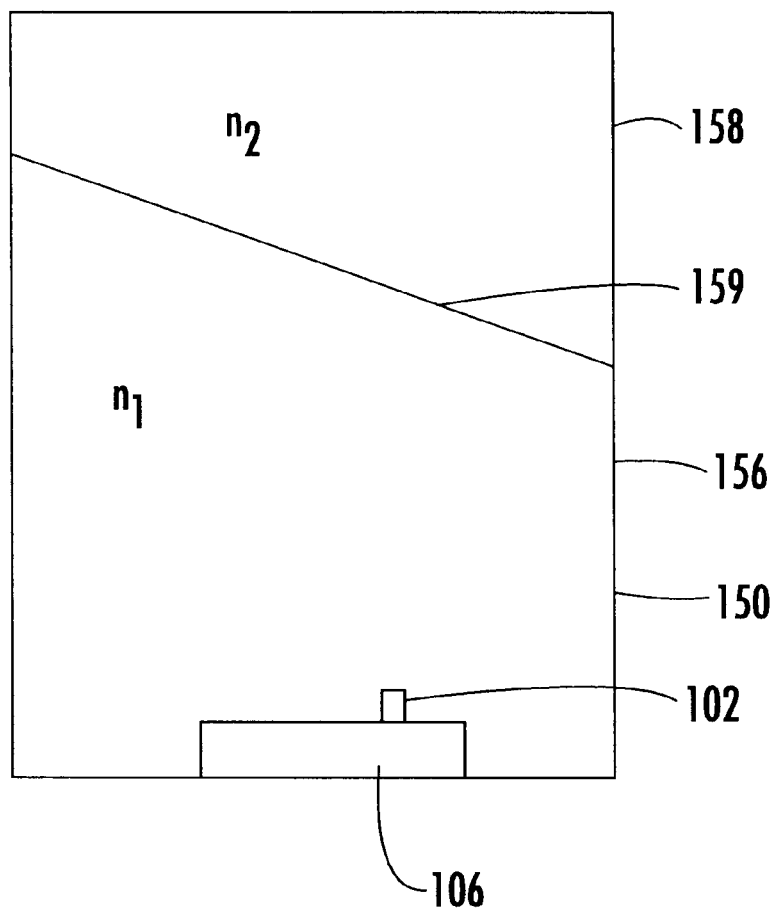
FIG. 13 is a diagram of another plastic package in which two similar index triangular plastic pieces are glued together at the hypotenuse with an index-matched glue. The first piece encapsulates the die, and the second piece has a ¼ wave reflective coating on the hypotenuse.

Referring to FIG. 13, another plastic package 150 may include two plastic pieces 156, 158, with similar refractive indices, (n1) and (n2) respectively, which are preferably coupled together along a tilted interface with an index-matched bonding material. The first piece 156 encapsulates the VCSEL 102 die, and the second piece 158 has a quarter wave reflective coating 159 having a refractive index n3 applied to the interface surface. In one embodiment, the refractive index n3 of the quarter wave coating 159 is preferably greater than indices n1 and n2 of the plastic pieces 156 and 158. The high index coating 159 preferably causes a portion of the radiated beam from the VCSEL 102 to be fed back to the photodiode 106. Alternatively, plastic pieces (156 and 158) may have dissimilar refractive indices so that the index discontinuity at the interface serves as the feedback source. The index break may also be provided by an air gap as discussed below.

Figure 14:
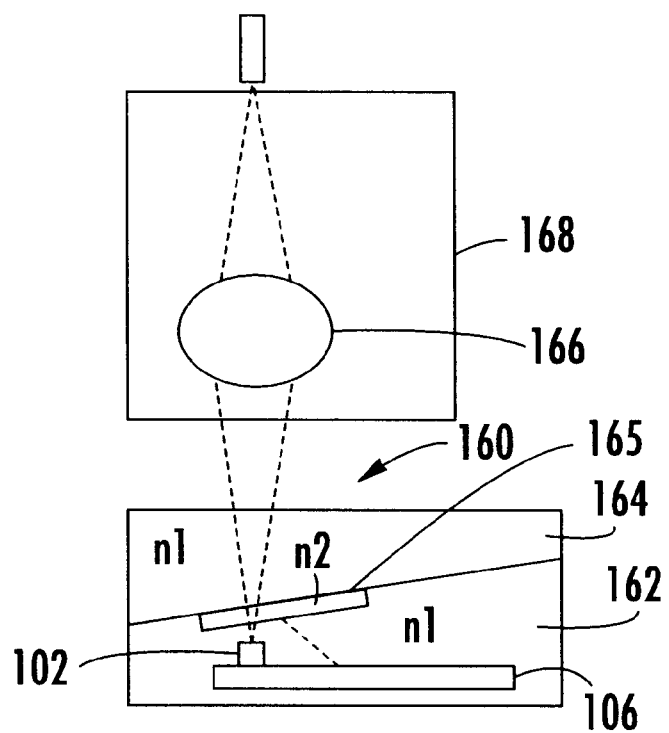
FIG. 14 is an alternate embodiment of FIG. 13 in which the two plastic pieces form an air-filled recess for providing feedback to the photodiode.

Referring to FIG. 14, an alternate plastic package 160 preferably includes two separate molds 162, 164 of material with the same refractive index (n1) coupled together to form an air-filled recess 165 (n2). The first mold 162 preferably encapsulates the VCSEL die 102 and photodiode 106 and the second mold 164 is preferably used for feedback. The geometry of the second mold is preferably substantially the same as the geometry of the first mold to ensure the same optical phase delay (OPD) for all rays. The two molds are preferably bonded together with index matched bonding material. The discontinuity in the index of refraction along the optical path formed by the plastic-air-plastic interface preferably acts as a window for providing feedback. A design requirement, not shown in the figure, is that the air preferably should not be trapped in a cavity but instead have a path to equilibrate with the outside environment. The lens 166 is preferably housed in a conventional lens barrel 168.

Figure 15:
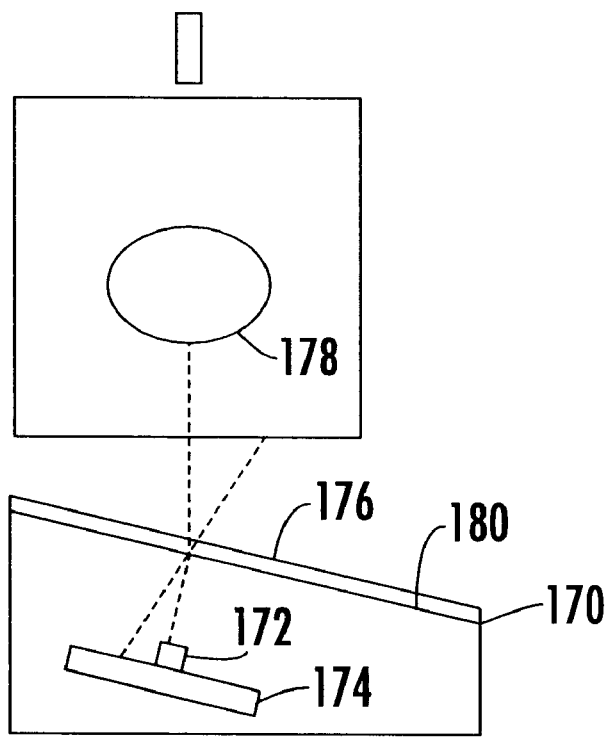
FIG. 15 is a diagram of a plastic package in which the VCSEL die and photodiode are tilted, and in which the plastic package itself has an angled surface. The angle of the tiled cap and the die are such that the refracted ray is along the axis of the lens.

Referring to FIG. 15, in a further alternate embodiment, a plastic package 170 preferably encapsulates a VCSEL die 172 and a photodiode 174 which are both tilted at an angle with respect to the base. The plastic package 170 further includes a tilted surface 180, in which the angle of tilt for both the surface 180 of the plastic package and the VCSEL die 172 are such that the emergent ray is along the optical axis of the ball lens 178. The surface 180 is preferably coated with a reflective layer 176 to adjust the feedback.

As the size of the package reduces, it may be necessary to place the photodetector in such close proximity to the lasing source that it is impractical to use two chips. In this case an N-I-P photodetector may be formed on top of the VCSEL and patterned to create a power monitoring detector adjacent or surrounding the VCSEL on the same chip. An example of an integrated VCSEL and N-I-P photodetector is disclosed in U.S. patent application Ser. No. 08/803,891, filed Feb. 02, 1997, the contents of which are hereby incorporated by reference as if set forth in full. The above disclosure is equally applicable, but the physical dimensions become more compact. This configuration may be particularly important when considering arrays of lasers where the tight pitch between active devices requires very small geometries for any power feedback system. In such an array application, one might power monitor only one of the lasers in the array to simplify the control circuitry.

Figure 22:
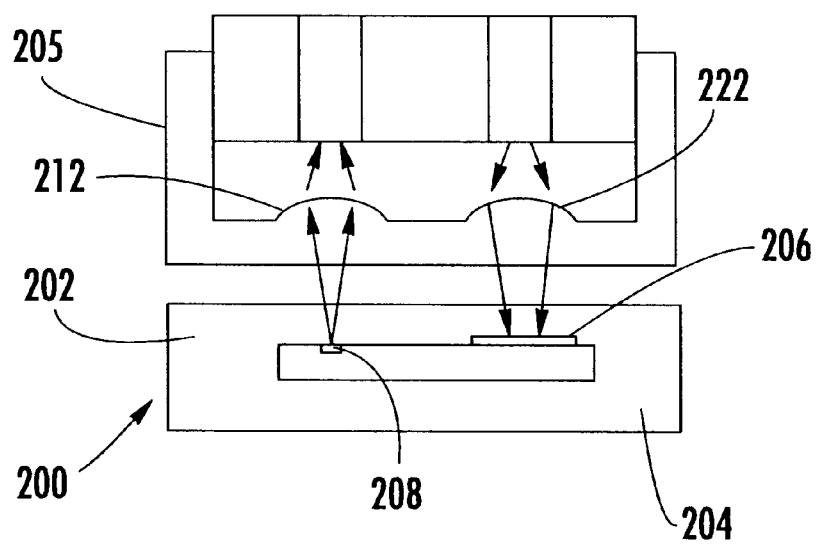

Referring to FIG. 22, the above power monitoring arrangements may be incorporated into a plastic system of lenses to provide transmit/receive functions. One method of construction, known as the small form factor (SMFF) package, encapsulates the laser and receiver in plastic, and then aligns and attaches a plastic lens/fiber connector piece onto the encapsulated devices. The benefit of this approach is that the plastic encapsulation may be performed with mechanical tolerances typical of the technology, on the order of 25 to 50 microns. The precise alignment to <5 µm of the fiber and lens to the devices is achieved during a subsequent alignment step, effectively decoupling the two technologies. For such applications the alignment may be done using active electrooptic measurements or with vision aided alignment. The advantage of a vision system is that the alignment may be done in an automated fashion, stepping from device to device on a regular pattern on a leadframe. This cassette driven approach may provide substantially higher throughput on the equipment, reducing overall cost.

Figure 16:
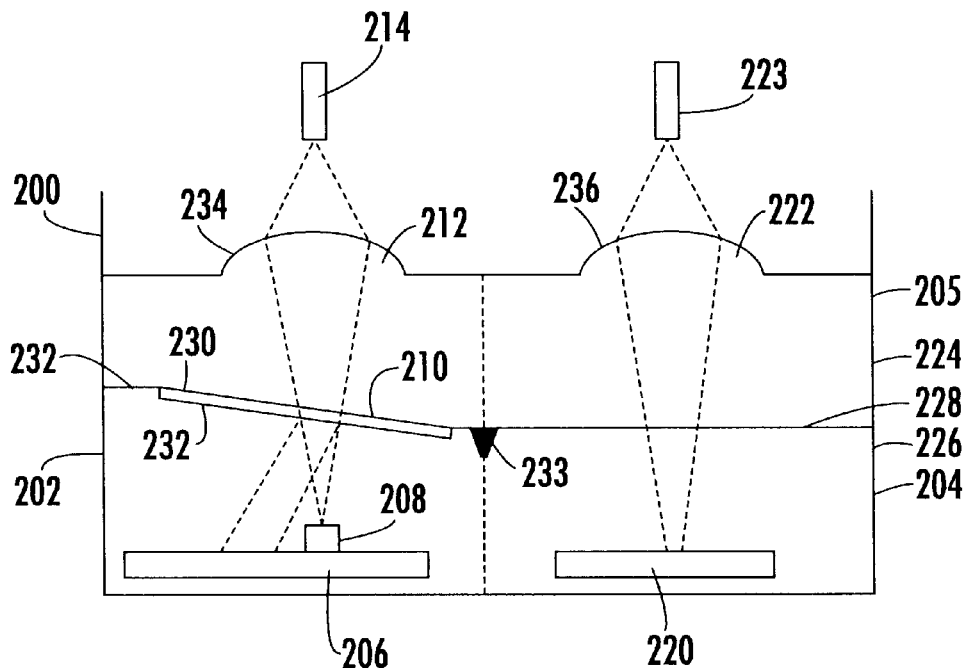
FIGS. 16–22 show alternate embodiments of the present invention incorporated within a small form factor package.

FIGS. 16–21 illustrate several optical layouts for transmitting the signal, reducing crosstalk, between the transmitter and receiver, and controlling the optical feedback to the monitor photodiode of the transmitter in a SMFF packaged transceiver. Referring to FIG. 16, the SMFF package 200 includes a molded transmitter portion 202, a molded receiver portion 204, and a fiber connector 205. The transmitter portion 202 includes an encapsulated power monitoring photodetector 206, an encapsulated VCSEL 208 mounted on the photodetector, an air gap window 210 in the optical path of the light beam radiated from the VCSEL, and a transmitter lens 212. The transmitter lens 212 couples the light from the VCSEL source 208 into an outgoing fiber 214. The receiver portion 204 includes an encapsulated photodetector 220 and a lens 222 for focusing light from an incoming fiber 223. The receiver and transmitter portions are preferably made from first and second molds 224, 226 of the same material, which material may be any suitable optically grade plastic, e.g., HYSOL. The molds 224, 226 of material are preferably attached using index-matched bonding material 228. A recess 230 at the angled face 232 between the two molds 224, 226 at the transmitter end creates the index discontinuity needed for back reflection to the power monitoring photodetector 206.

Alternately, the air gap may be replaced with a piece of encapsulated glass or plastic of suitable index for back reflection. The window is preferably placed at an angle relative to the source-lens. A barrier 233 between the transmitter portion and receiver portion is used to reduce crosstalk between them. The barrier is preferably a notch having a 45 degree angle or more. The lenses that collect and focus the beam are preferably aspheric curved surfaces 234, 236 formed on the first mold 224.

Figure 17:
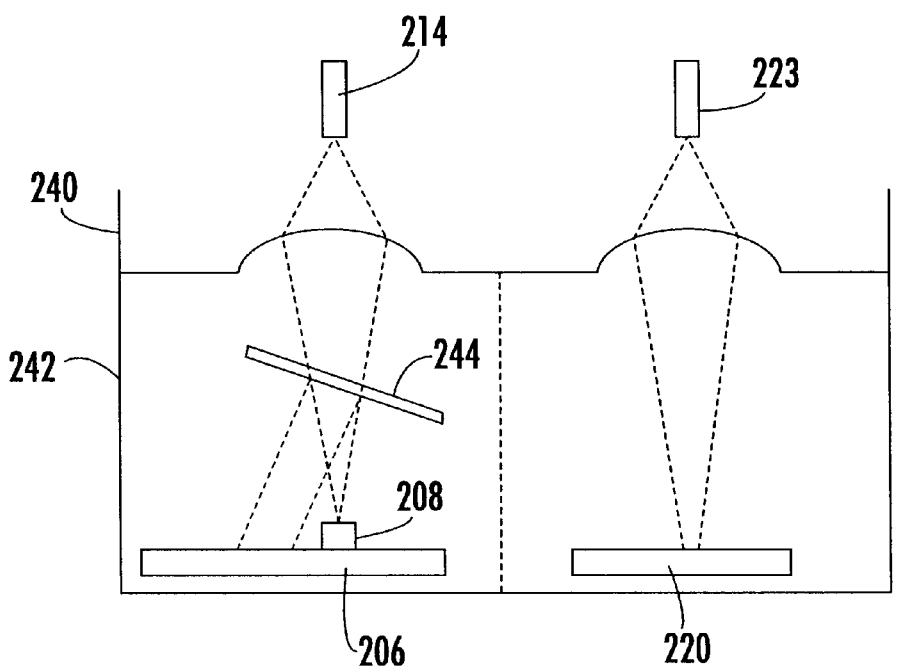

Referring to FIG. 17, in an alternate embodiment of the SMFF package of FIG. 16, an entire SMFF plastic package 240 is preferably formed from a single mold 242. An angled and reflectively coated piece of plastic or glass plate 244 of a different index is preferably placed inside the mold during the molding process.

Figure 18:
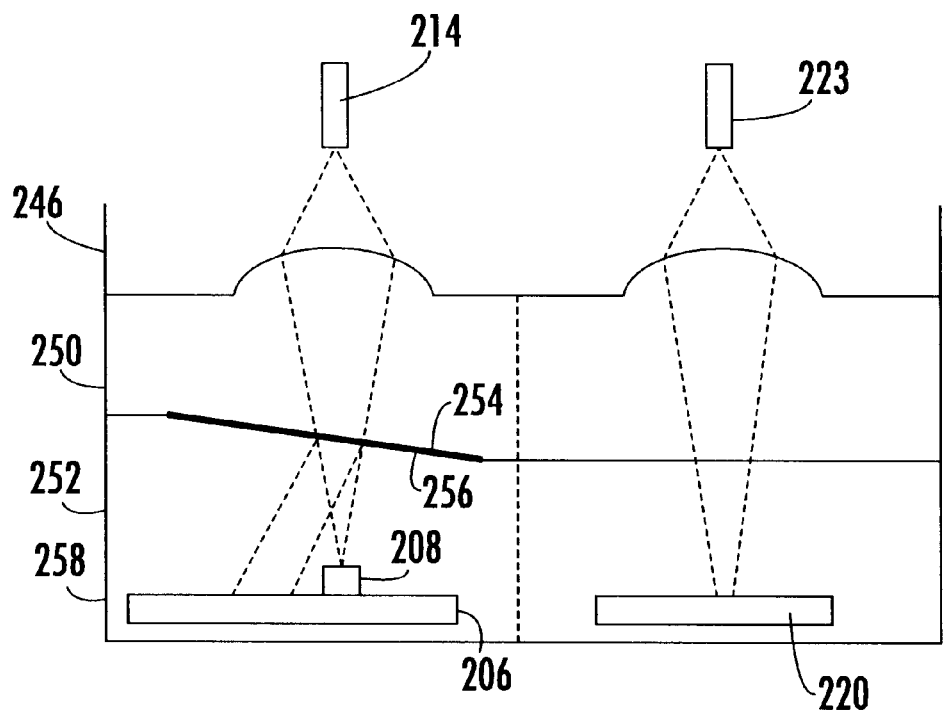

Referring to FIG. 18, in another alternate embodiment, a SMFF plastic package 246 preferably has two separate molds 250 and 252, one for housing a laser 208, and the other for providing the feedback plate and focusing the beam. The two molds 250, 252 may have the same refractive index or different indices. In this embodiment, feedback to the power monitoring photodetector 206 is preferably obtained by coating the second mold 252 with a reflective coating 254 at an angled face 256 corresponding to the transmitter portion 258 of the package.

Figure 19:
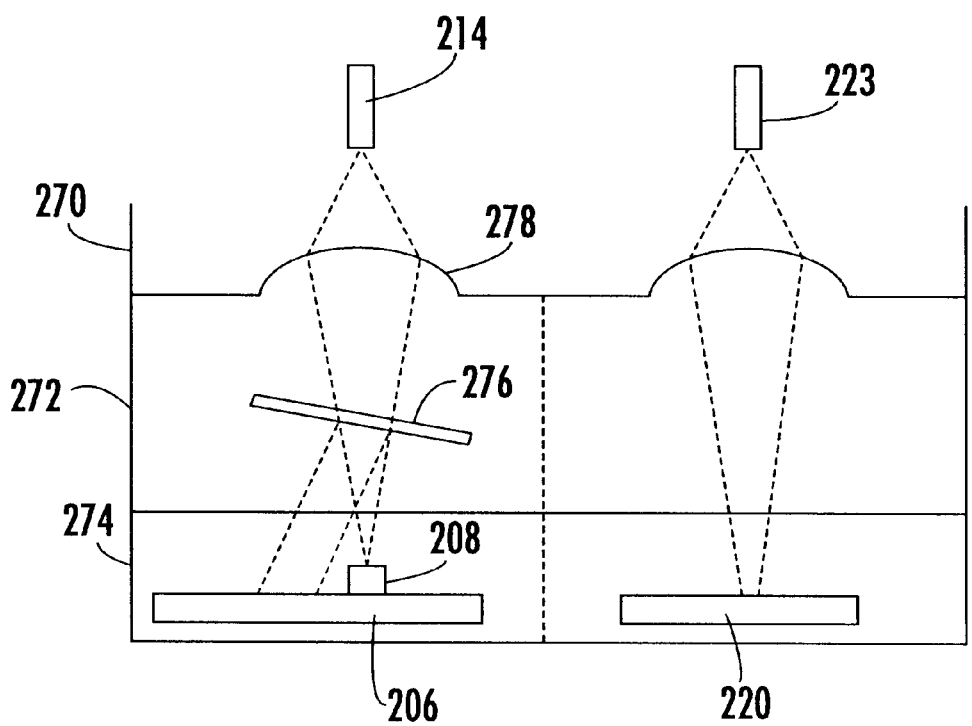

Referring to FIG. 19, in a further alternate embodiment, a SMFF plastic package 270 preferably has two separate molds, wherein one mold 274 houses the laser, and a separate mold 272 houses a feedback plate 276 and focusing lens 278. The feedback plate 276 is preferably coated with a reflective coating and is preferably placed inside the molded material 272 during the molding process.

Figure 20:
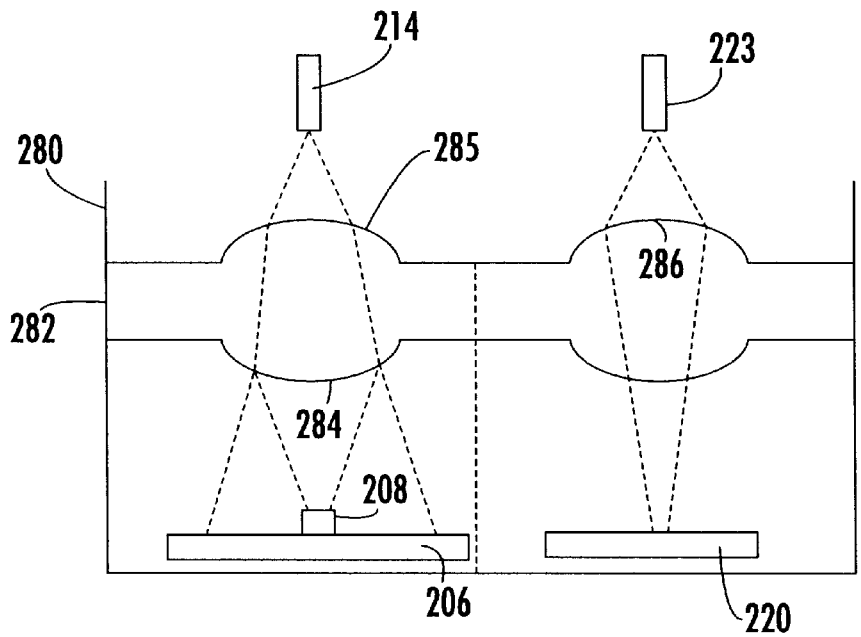

Referring to FIG. 20, in yet another embodiment, a SMFF plastic package 280 preferably includes a biconvex lens 282, which both focuses the beam to the fiber and acts as the feedback source for the monitor diode. The curvatures and the indices of the lens are calculated to yield a 1:1 magnification for the optical system. The feedback to the monitor diode 206 is obtained from a first lens surface 284, and the focusing into the fiber is accomplished through a second lens surface 285. In this embodiment, the fiber 214 and the VCSEL source 208 are preferably de-centered from the optical axis to prevent the back-reflection from the fiber face from entering the laser cavity.

Figure 21:
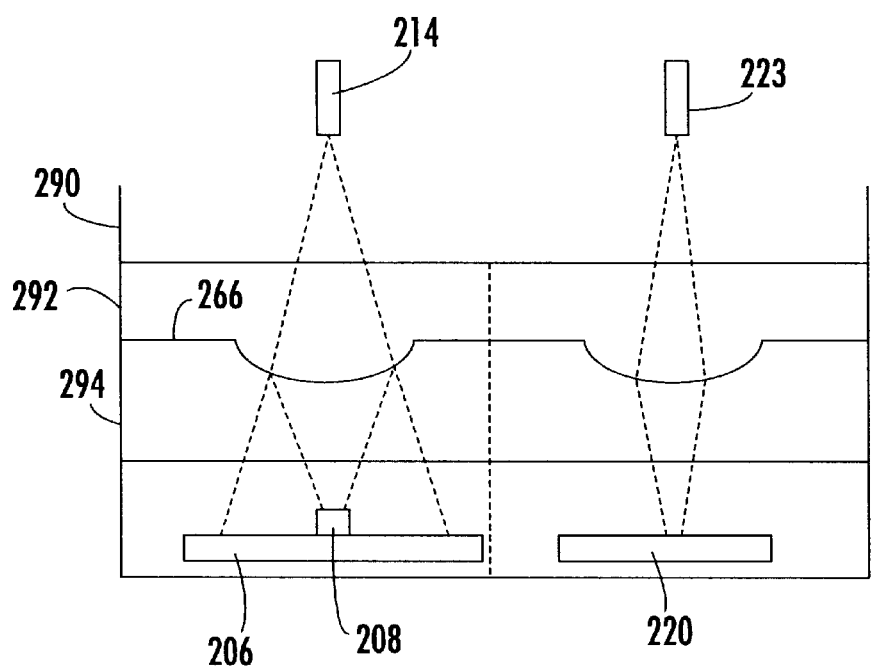

Referring to FIG. 21, in an alternate embodiment of FIG. 20, in a SMFF plastic package 290, preferably has two molds 292, 294 of different indices coupled together by a suitable bonding material 296. The first mold 292 is a plano-convex lens that serves both as a feedback source as well as a focusing element for the laser beam.

Figure 23:
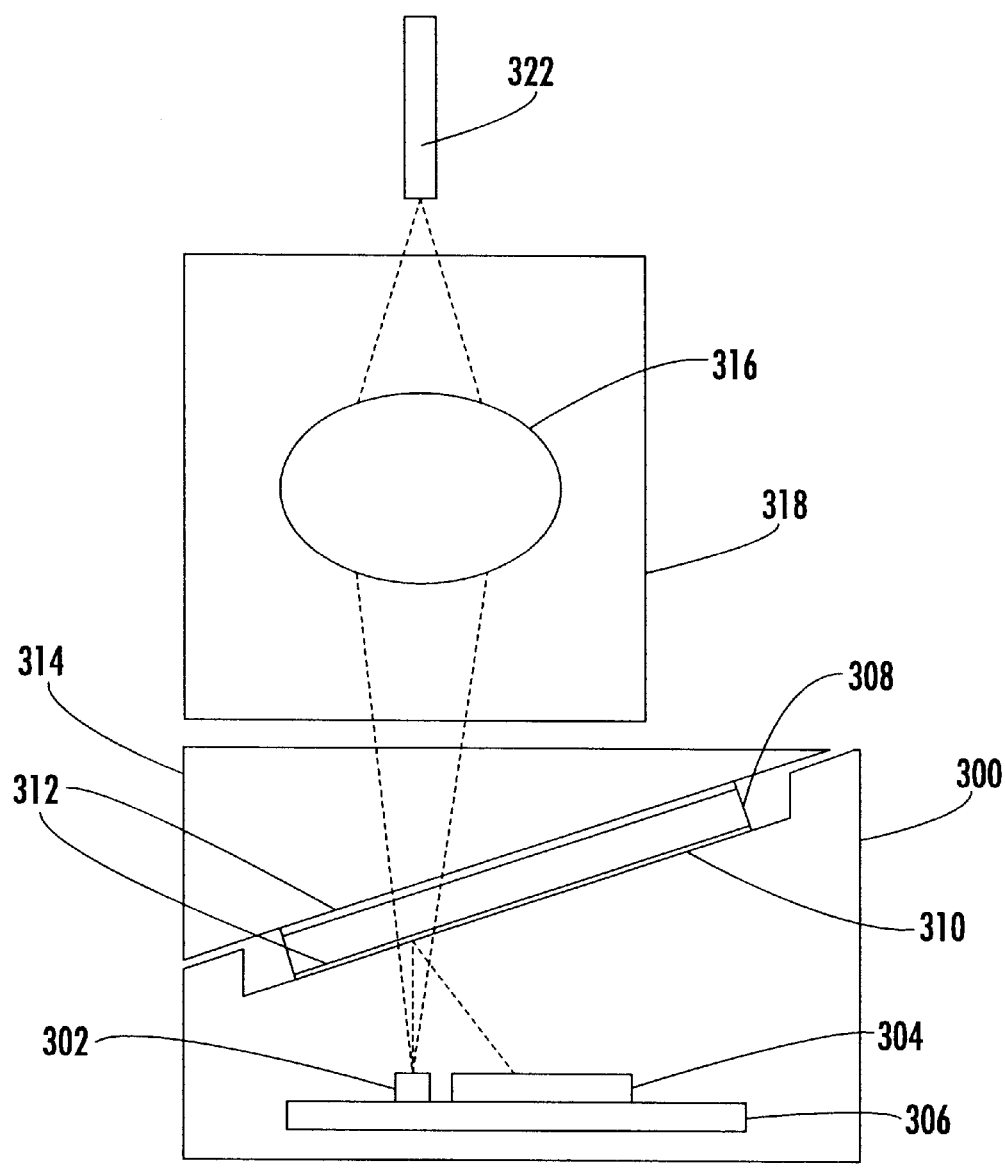
FIG. 23 is a cross sectional diagram of plastic molded package with a VCSEL adjacent to a power monitoring photodetector, and a tilted window with a reflective coating for providing feedback to the photodetector.

Referring to FIG. 23, in a preferred embodiment of the invention, a plastic molded package 300 (index n1) (n1) encapsulates the VCSEL die 302, photodiode 304 and substrate 306. The substrate 306 may be any material suitable for the attachment of semiconductor die, such as a metal leadframe, a ceramic substrate, or a standard printed circuit board epoxy/glass laminate. In the preferred embodiment, a tilted window 308, preferably made of glass having an index of refraction (n2), is coupled to the plastic molded package 300. The tilted window 308 is preferably coated with a ¼ wave reflective coating 310, having an index of refraction (n3) that may be tailored to obtain optimal monitoring and feedback. In the preferred embodiment, an optically clear epoxy 312 with a refractive index (n4), that substantially matches the refractive index n1 of the plastic molded package 300, couples the tilted window 308 to the plastic molded package 300. The reflectance of the tilted window and quarter wave coating may be adjusted by adjusting the index ratio n2/n3.

In this embodiment, the index of refraction of the quarter wave coating 310 is preferably higher than the refractive index (n1) of the plastic molded package 300. Preferably, the refractive index of the plastic molded package, n1, and the refractive index of the tilted window n2, are comparable. Therefore, the power reflected at the interface of the tilted window 308 and the plastic molded package 300, given by the square of the ratio (n1−n2)/(n1+n2), is relatively small. In the preferred embodiment, the refractive index n3 of the quarter wave reflective coating 310 may be tailored to significantly reflect incident light utilizing readily implemented manufacturing processes.

For example, if the refractive index of the plastic molded package n1 is 1.5 and the tilted window 308 has a refractive index n2 of 1.45, the net reflection at the interface of the plastic molded package and the tilted window would be approximately 0.03%. However, treating the tilted window 308 with a quarter wavelength thick layer of silicon nitride, with a refractive index n3 of 2.0, increases the reflected power to 9%. Advantageously, the silicon nitride may be uniformly and precisely deposited using conventional techniques such as plasma enhanced chemical vapor deposition. The quarter wave reflective coating 310 should preferably be uniform to avoid distorting the beam. In addition, the optimum quarter wave thickness may be effectively realized inconjunction with multiple half wavelength deposits of the coating as may be desirable from a manufacturing perspective, (thickness=¼λ+nλ/2, where n is an integer).

A glass or plastic triangular shaped plastic piece 314 may be coupled to the top surface of the tilted window 308 using an optically transparent epoxy 312 with a refractive index (n4) which substantially matches the refractive index of the tilted window (n2). A lens 316 is preferably housed in a conventional lens barrel 318.

As an alternative to applying a ¼ wave reflective material such as silicon nitride on the tilted window 308, a thin metallic coating on the window may also be utilized to control the power level of light reflected from the tilted window 308. For example, a layered coating of titanium and gold may be used to reflect a small percentage of the beam while transmitting the majority of the beam through the coating. An alternate embodiment includes a titanium layer in the range 20 to 50 Angstroms, deposited directly on the tilted window 308, followed by a 100 to 200 Angstrom layer of gold deposited on the layer of titanium.

Figure 24:
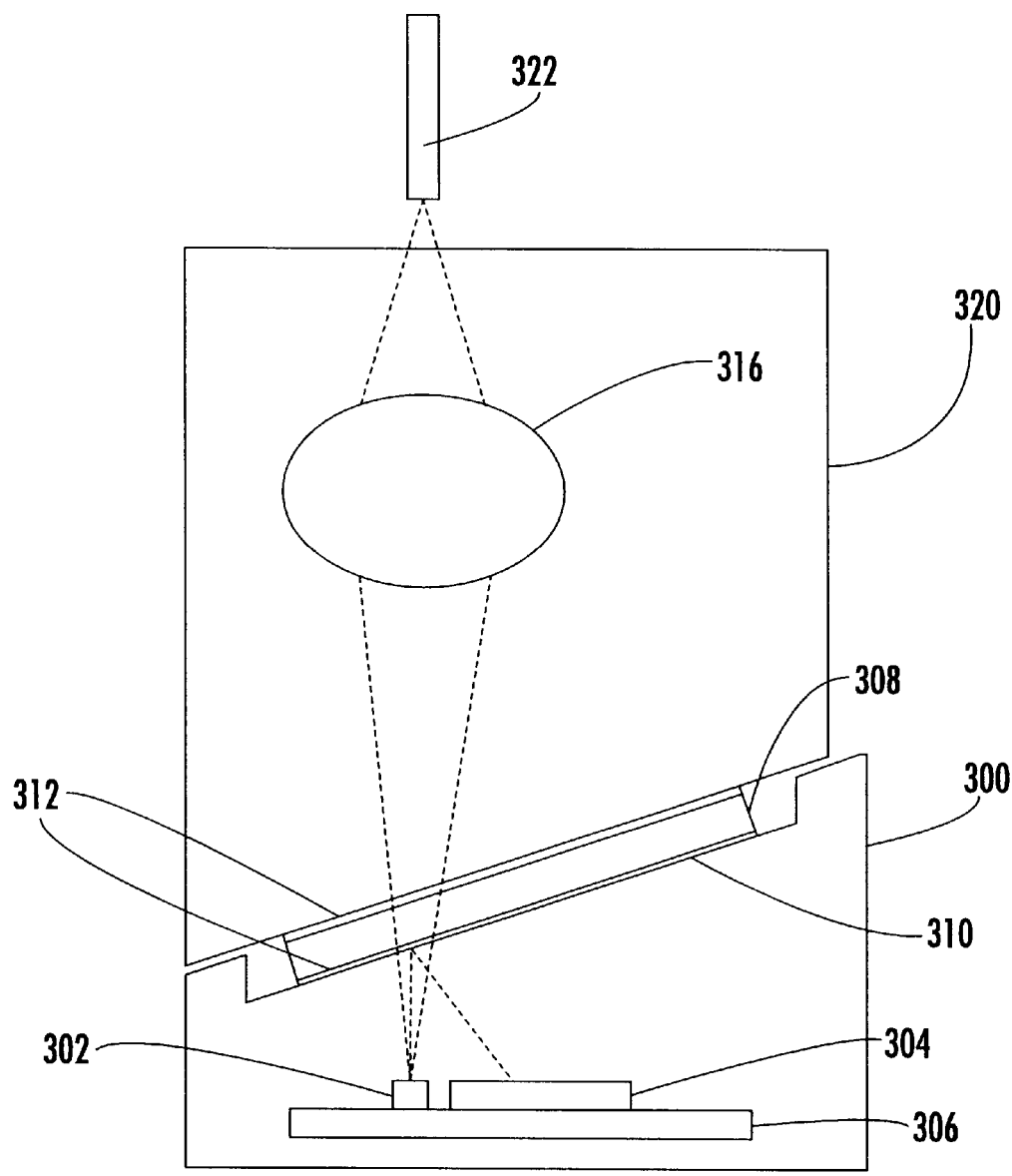
FIG. 24 is a cross sectional diagram of plastic molded package with a VCSEL adjacent to a power monitoring photodetector, a tilted window with a reflective coating for providing feedback to the photodetector and a separate, single plastic piece containing a lens barrel and a focusing lens for focusing the transmitted light into a fiber.

Referring to FIG. 24 in an alternative embodiment to FIG. 23, a single plastic molded piece 320, containing lens 316 may be coupled to the top surface of the tilted window 308 using an optically transparent epoxy 312 with a refractive index (n4) which substantially matches the refractive index of the tilted window (n2). The use of a single plastic mold of material 320 allows fiber 322 to be readily aligned with VCSEL transmitter 302 using standard optical alignment techniques.

Although a preferred embodiment of the present invention has been described, it should not be construed to limit the scope of the appended claims. Those skilled in the art will understand that various modifications may be made to the described embodiment. For example, a VCSEL, a power monitoring photodetector, a receiving photodetector and amplifier circuitry may be fabricated on a single monolithic wafer. The monitoring photodetector may be below the VCSEL or on the side or in another location within the package, which, together with the tilted beamsplitter and geometry of the package, provide controlled monitoring and feedback. Moreover, to those skilled in the various arts, the invention itself herein will suggest solutions to other tasks and adaptations for other applications. It is therefore desired that the present embodiments be considered in all respects as illustrative and not restrictive, reference being made to the appended claims rather than the foregoing description to indicate the scope of the invention.

What is claimed is:

1. A VCSEL assembly comprising:
   a VCSEL positioned on a substrate, said VCSEL operable to emit light along a first path normal to said VCSEL;
   a photo detector positioned on a substrate;
   an optically transmissive plastic housing substantially encapsulating said VCSEL and said photo detector, said plastic housing having an index of refraction n1, said housing having an upper surface proximate to said VCSEL and said photo detector;
   a beam splitter proximate to said upper surface of said housing, said beam splitter being tilted at an angle relative to said first path and operable to reflect a portion of said emitted light along a second path to said photo detector,
   said photo detector producing a signal as function of said reflected light for controlling power of said VCSEL.

2. The VCSEL assembly of claim 1 wherein said upper surface of said housing is tilted at an angle relative to said first path and said beam splitter is positioned on said tilted upper surface.

3. The VCSEL assembly of claim 2 wherein said beam splitter comprises a window coupled to said upper surface of said housing, said window having an index of refraction n2, wherein n2<n1.

4. The VCSEL assembly of claim 3 wherein said window is coated with a reflective material having an index of refraction n3, wherein n3>n1, said window being coupled to said upper surface using an optically clear epoxy having an index of refraction n4, wherein n4 is substantially equal to n1.

5. The VCSEL assembly of claim 4 wherein said beam splitter comprising a reflective coating on said upper surface of said housing, said reflective coating having an index of refraction n3, wherein n3>n1.

6. The VCSEL assembly of claim 1 wherein said upper surface of said housing includes a recess having a ledge, said beam splitter comprising a window having an index of refraction n2, wherein n2<n1 and further wherein said window is positioned on said ledge such that said window is tilted at an angle relative to said first path and an air gap is formed between said upper surface of said housing and said window, said air gap having an index of refraction n5 wherein n5<n2<n1.

7. The VCSEL assembly of claim 1 wherein said beam splitter comprises a window encapsulated within said housing.

8. The VCSEL assembly of claim 1 wherein said beam splitter comprises a window positioned above said upper surface of said housing.

9. The VCSEL assembly of claim 1 further comprising a secondary optically transmissive plastic housing portion having a lower surface coupled to said upper surface of said housing, said upper surface of said housing and said lower surface of said secondary housing having intermitting mated lens surfaces formed thereon for focusing emitted light from said VCSEL.

* * * * *